US012696555B2

(12) United States Patent
He et al.

(10) Patent No.: US 12,696,555 B2
(45) Date of Patent: Jul. 28, 2026

(54) PHOTODIODE AND MANUFACTURING METHOD THEREOF

(71) Applicant: PixArt Imaging Inc., Hsin-Chu City (TW)

(72) Inventors: Ren-Yu He, Hsin-Chu City (TW); Yu-Wei Wang, Hsin-Chu City (TW)

(73) Assignee: PixArt Imaging Inc., Hsin-Chu City (TW)

( * ) Notice: Subject to any disclaimer, the term of this patent is extended or adjusted under 35 U.S.C. 154(b) by 748 days.

(21) Appl. No.: 18/129,108

(22) Filed: Mar. 31, 2023

(65) Prior Publication Data

US 2023/0369378 A1    Nov. 16, 2023

Related U.S. Application Data

(63) Continuation-in-part of application No. 17/740,371, filed on May 10, 2022, now Pat. No. 12,613,319.

(51) Int. Cl.
*H10F 39/18* (2025.01)
*H10F 39/00* (2025.01)

(52) U.S. Cl.
CPC ....... *H10F 39/1847* (2025.01); *H10F 39/014* (2025.01); *H10F 39/8033* (2025.01)

(58) Field of Classification Search
CPC ... H10F 39/847; H10F 39/014; H10F 39/8033
See application file for complete search history.

(56) References Cited

U.S. PATENT DOCUMENTS

| | | | | |
|---|---|---|---|---|
| 2006/0086955 A1* | 4/2006 | Iwata | | H10F 39/014 |
| | | | | 257/226 |
| 2015/0028386 A1* | 1/2015 | Shi | | H10F 77/413 |
| | | | | 438/72 |
| 2018/0019268 A1* | 1/2018 | Zhang | | H10F 39/199 |
| 2020/0105812 A1* | 4/2020 | Sze | | H10F 39/199 |
| 2021/0343762 A1* | 11/2021 | King | | H10F 39/8037 |
| 2022/0102397 A1* | 3/2022 | Wu | | H10F 39/807 |

FOREIGN PATENT DOCUMENTS

CN          114284376 A      4/2022

* cited by examiner

*Primary Examiner* — Alexander G Ghyka
(74) *Attorney, Agent, or Firm* — Winston Hsu

(57) ABSTRACT

A photodiode comprises a substrate, a first collection layer, a first type well layer, a second type well layer and a second collection layer. The substrate has a first surface and a second surface. The substrate defines a bias region and a signal region. The first collection layer, the first type well layer, the first type well layer, the second type well layer, and the second collection layer are formed in the substrate. The first type well layer is disposed between the first surface and the first collection layer. The second type well layer is disposed between the first type well layer and the first collection layer. The second collection layer is located between the first surface and the second well layer.

5 Claims, 15 Drawing Sheets

PHOTODIODE AND MANUFACTURING METHOD THEREOF

CROSS REFERENCE TO RELATED APPLICATIONS

This application is a continuation-in-part of U.S. application Ser. No. 17/740,371, filed on May 10, 2022. The content of the application is incorporated herein by reference.

BACKGROUND OF THE INVENTION

1. Field of the Invention

The present disclosure relates to a photodiode and manufacturing method thereof, and particularly relates to a photodiode which has different light sensitivities and can improve photon detection efficiencies.

2. Description of the Prior Art

In recent years, an optical distance measuring device becomes more and more popular. Such optical distance measuring device has an image sensor for capturing images which are used for distance computation. However, the pixels in the conventional image sensor have the same light sensitivities. Thus, the overexposure issue may happen thus causes non accurate distance computation. For example, if the optical distance measuring device is too close to an object, the image sensor may receive strong reflected light from the object, thus the overexposure issue occurs.

Also, the conventional photodiode may have a low photon detection efficiency since it is hard to attract the electrons in a deep p-type substrate. Alternatively, the p-type substrate needs to be coupled to a negative voltage level. However, the p-type substrates of some other circuits could not be coupled to the negative voltage level. Therefore, such structure may cause the difficulty for designing an IC (Integrated Circuit) comprising a photodiode.

SUMMARY OF THE INVENTION

Therefore, one objective of the present disclosure is to provide a photodiode having pixels with different light sensitivities.

In view of this, the present invention provides a photodiode, which has better performance in detecting near infrared (NIR) and short wave infrared (SWIR) by using multiple collection layers.

The present invention also provides a method for manufacturing a photodiode, with which the aforesaid the photodiode can be manufactured.

The photodiode of the present invention comprises a substrate, a first collection layer, a first type well layer, a second type well layer and a second collection layer. The substrate has a first surface and a second surface opposite to the first surface, wherein the substrate defines a bias region, a ground region and a signal region. The first collection layer is formed in the substrate and doped with a first semiconductor material, wherein the first collection layer is located within the bias region and the signal region. The first type well layer is formed in the substrate and disposed between the first surface and the first collection layer, wherein the first type well layer is located within the bias region. The second type well layer is formed in the substrate and disposed between the first type well layer and the first collection layer, wherein the second type well layer is located within the bias region and signal region. The second collection layer is formed in the substrate and doped with a second semiconductor material, wherein the second collection layer is located between the first surface and the second well layer.

In an embodiment of the present invention, the photodiode further comprises a first type semiconductor layer located between the first type well layer and the second well layer, wherein the first type semiconductor layer and the second type well layer are doped with the same or similar semiconductor material.

In an embodiment of the present invention, the photodiode further comprises a buffer material layer partially formed on the first surface of the substrate and partially formed in the substrate, wherein the portion of the buffer material layer is disposed between the second collection layer and the first type well layer.

In an embodiment of the present invention, the photodiode further comprises a semiconductor material connection layer formed in the substrate and located within the signal region, wherein the semiconductor material connection layer is physically connected with the second type well layer. The semiconductor material connection layer and the second type well layer are doped with the same material or similar semiconductor material.

In an embodiment of the present invention, the photodiode further comprises a semiconductor material ground layer formed in the substrate and located within the ground region.

In an embodiment of the present invention, the photodiode further comprises a semiconductor material insulator layer formed in the substrate and located between the signal region and the ground region.

The method for manufacturing a photodiode comprises at least the following steps. First, a substrate is provided, wherein the substrate has a first surface and a second surface opposite to the first surface, the substrate defines a bias region, a ground region and a signal region. Then, a first collection layer is formed in the substrate by using a first semiconductor material, wherein the first collection layer is located within the bias region and the signal region. Next, a first type well layer is formed in the substrate, wherein the first type well layer disposed between the first surface and the first collection layer is located within the bias region. Then, a second type well layer is formed in the substrate, wherein the second type well layer disposed between the first type well layer and the first collection layer is located within the bias region and signal region. Next, a groove exposing the first type well layer is formed on the first surface of the substrate. Then, a second collection layer is formed in the groove of the substrate by using a second semiconductor material.

According to the above descriptions, because the photodiode of the present invention has a double absorption layer structure with different semiconductor materials, so that the photodiode of this embodiment can detect near-infrared rays (NIR) and short-wave infrared rays (SWIR), and then the photodiode will have better performance and wider application. Specifically, the photodiode of this embodiment can detect not only the light with a wavelength of 400 nm-1100 nm, but also the light with a wavelength of 400 nm-1700 nm, so as to improve the application range and performance. In this embodiment, a method for fabricating the above-mentioned photodiode will be provided.

The objectives, technical details, features, and effects of the present invention will be better understood with regard to the detailed description of the embodiments below.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
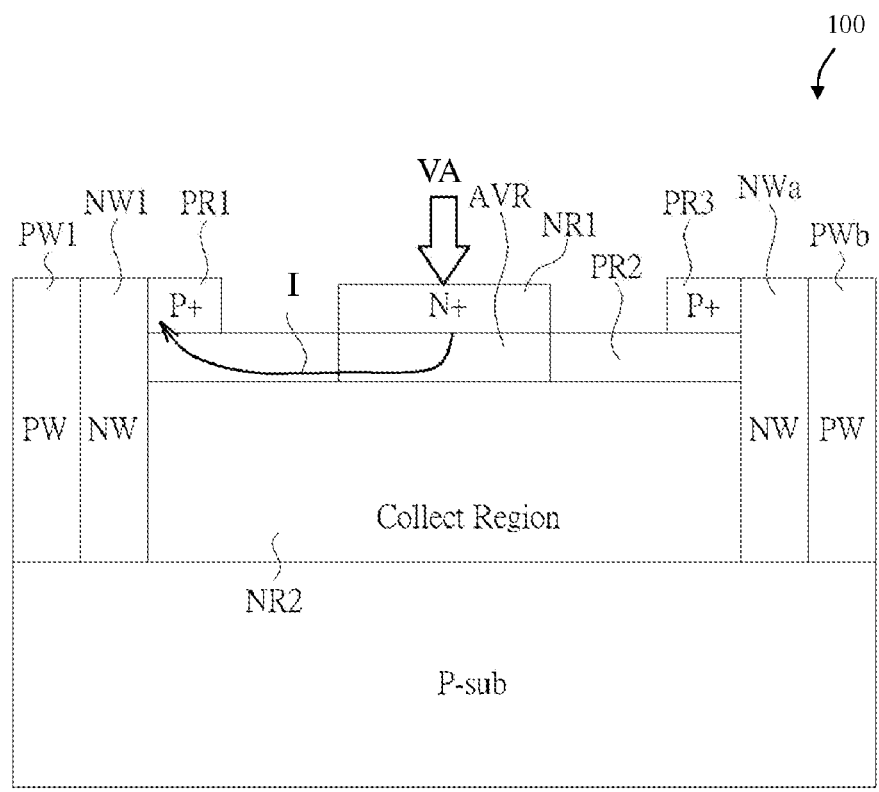
FIG. 1, FIG. 2, and FIG. 3 are cross sectional views illustrating photodiodes according to different embodiments of the present disclosure.

The term "first", "second", "third" in following descriptions are only for the purpose of distinguishing different one elements, and do not mean the sequence of the elements. For example, a first device and a second device only mean these devices can have the same structure but are different devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please note, the following image sensors, optical sensors, photodiodes, photo sensitive elements, photodetectors, single photo avalanche diodes (SPAD), semiconductor structures, and pixel circuits are not limited to be applied to a distance measuring device.

One example of such an image sensor is including an array of pixel circuits. Each of the pixel circuits comprises a photodetector disposed in a semiconductor substrate. The photodetector comprises a p-n junction that exists between a first doped region, which has a first doping type (e.g., n-type doping), and second doped region, which has a second doping type (e.g., p-type doping) opposite the first doping type. That is, the first doping type means having a first conductivity type, and the second doping type means having a second conductivity type. The first conductivity type opposite the second conductivity type.

Some complementary metal-oxide-semiconductor (CMOS) image sensors comprise a SPAD disposed in the semiconductor substrate. The SPAD is a photodetector configured to absorb incident radiation (e.g., infrared radiation or visible radiation) and output electrical signals having a relatively large avalanche current compared to an amount of photo-generated charge carriers created in the photodetector (e.g., due to absorbing a photon). The SPAD comprises a pair of first wells having a first doping type (e.g., n-type doping) disposed in the semiconductor substrate. A second well having a second doping type (e.g., p-type doping) opposite the first doping type is disposed in the semiconductor substrate between the first wells. A doped layer is disposed in the semiconductor substrate below the second well and extends between the first wells. The second well contacts the doped layer in a vertical direction between the first wells. Thus, a p-n junction exists between the second well and the doped layer. Accordingly, a depletion region is formed (e.g., due to the p-n junction between the second well and the doped layer) along the second well and the doped layer.

An active region AR is a region which forms a p-n or n-p junction that converts photons into current.

Figure 2:
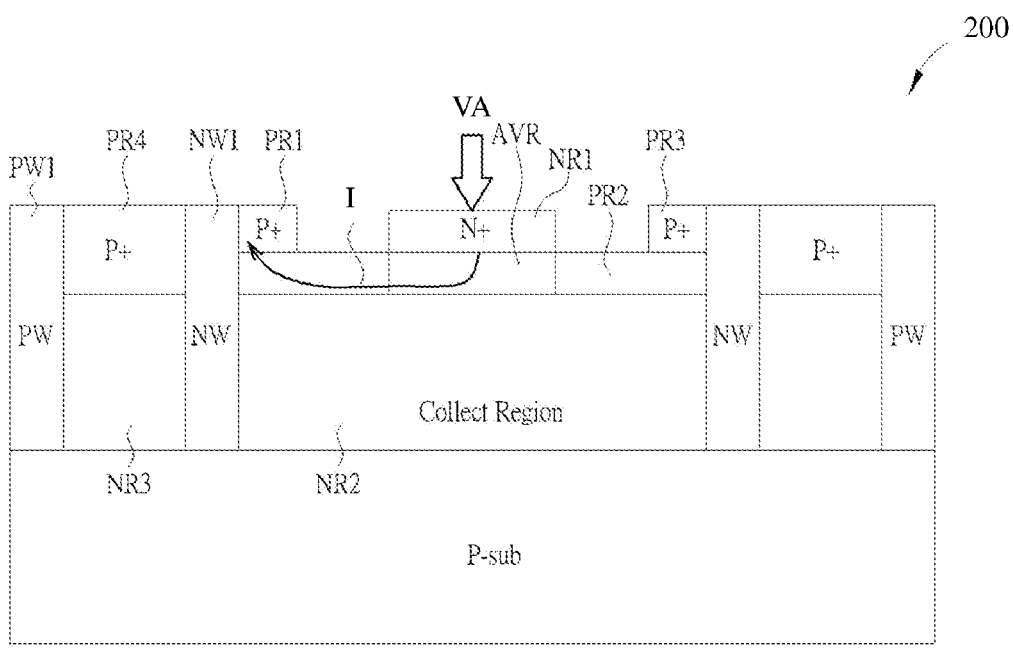
Figure 3:
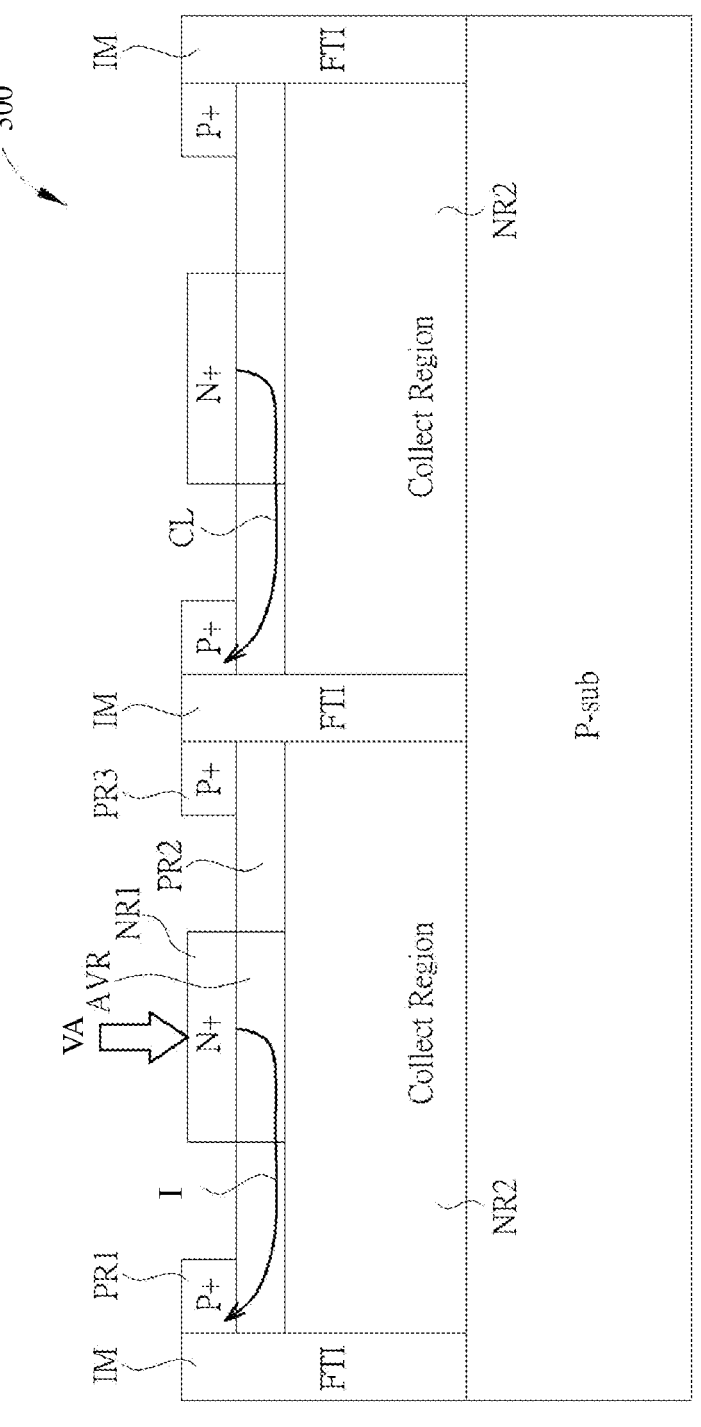

The present disclosure also discloses photodiodes which can improve photon detection efficiencies. FIG. 1, FIG. 2, and FIG. 3 are cross section views illustrating photodiodes according to different embodiments of the present disclosure. Such photodiodes can also be used as the high sensitivity photodiodes illustrated in above-mentioned embodiments.

As illustrated in FIG. 1, the photodiode 100 comprises: a p-type substrate P-sub, a first N doped region NR1, a second N doped region NR2, a first P doped region PR1, a second P doped region PR2, a third P doped region PR3, a first N-well NW1, and a first P-well PW1. The doping concentration of the first P doped region PR1 is higher than the doping concentration of the second P doped region PR2. Also, the doping concentration of the first N doped region NR1 is higher than the doping concentration of the second N doped region NR2. Please note, the photodiode 100 in FIG. 1 is a symmetrical structure, thus it also has an N-well NWa corresponding to the first N-well NW1 and a P-well PWb corresponding to the first P-well PW1, at the right side thereof. In one embodiments, the first P-well PW1 and the P-well PWb are for isolating different photodiodes. The embodiments illustrated below also follow the same rule.

The first P doped region PR1 is provided in the p-type substrate P sub, and is served as a signal output region for outputting a radiation sensing signal V Sn. Specifically, the first P doped region PR1 outputs a light sensing current I corresponding to the light received by the photodiode 100. The first N doped region NR1 is provided in the p-type substrate P sub, for receiving a bias voltage VA, which includes a breakdown voltage VBD of SPAD and an excess bias voltage Vex, that is, VA=VBD+Vex. In this embodiment, the bias voltage VA is positive. The second P doped region PR2 provided in the P-type substrate P-sub, is below the first P doped region PR1 and the first N doped region NR1. An avalanche region AVR is formed between the second P doped region PR2 and the first N doped region NR1 when the bias voltage VA is larger than the breakdown voltage VBD.

The second N doped region NR2 is disposed below the second P doped region PR2. Also, the first N-well NW1 is provided in the p-type substrate P-sub and next to the first P doped region PR1 and the second N doped region NR2. Additionally, the first P-well PW1 is provided in the p-type substrate P-sub and next to the first N-well NW1. The second N doped region NR2 can be regarded as a collection region for help collecting the electrons in the p-type substrate P-sub there below.

The photodiode provided by the present disclosure is not limited to the structure illustrated in FIG. 1. For example, in one embodiment, the photodiode does not comprise the second doped region NR2. Also, as illustrated in FIG. 2, besides the p-type substrate P-sub, the first N doped region NR1, the second N doped region NR2, the first P doped region PR1, the second P doped region PR2, the third P doped region PR3, the first N-well NW1, and the first P-well PW1 illustrated in FIG. 1, the photodiode 200 further comprises a fourth P doped region PR4 and a third N doped region NR3. The fourth P doped region NR4 is provided in the p-type substrate P-sub and next to the first N well NW1. The third N doped region NR3 is provided in the p-type substrate P-sub, next to the first N well NW1 and below the fourth P doped region PR4. The fourth doped region PR4 can be used for protecting the photodiode. The third N doped region NR3 is also served as a collection region for help collecting the electrons in the p-type substrate P-sub there below.

The photodiode 200 in FIG. 2 can further comprise a first P-well PW1 provided in the p-type substrate P-sub and next to the fourth P doped region PR4 and the third N doped region NR3. The first P-well PW1 can be used for isolating different photodiodes.

In the embodiment of FIG. 2, the fourth P doped region PR4, the third N doped region NR3 and the p-type substrate P-sub can be regarded as a photodiode. Therefore, the photodiode 200 in FIG. 2 can be regarded as: a photodiode, comprising: a first photodiode, comprising a p-type substrate (e.g., the p-type substrate P-sub) and a signal output region (e.g., the first P doped region PR1); a positive electric field providing structure, provided in the p-type substrate, configured to receive a positive bias voltage (e.g., the first doped region NR1 receiving the positive bias voltage VA) to provide a positive electric field according to the bias voltage to attract electrons in the p-type substrate. An avalanche region is formed when the bias voltage VA is larger than a breakdown voltage VBD of the SPAD, thereby a current path is formed between the signal output region and the positive electric field providing structure. In one embodiment, besides the first doped region NR1, the positive electric field providing structure further comprises the second doped region NR2.

FIG. 3 is a schematic diagram illustrating a photodiode according to another embodiment of the present disclosure. As illustrated in FIG. 3, besides the p-type substrate P-sub, the first N doped region NR1, the second N doped region NR2, the first P doped region PR1, the second P doped region PR2, and the third P doped region PR3 illustrated in FIG. 1, the photodiode 100 further comprises isolation structure IM provided next to the first P doped region PR1 the second P doped region PR2, and the second N doped region NR2. The isolation structure IM can be used for isolating different photodiodes, which can implemented be various structures. In one embodiment, the isolation structure IM is a FTI (full trench isolation structure).

In one embodiment, the third P doped region PR3 and the first P doped region PR1 in above-mentioned embodiments are coupled to a resistor.

Figure 4A:
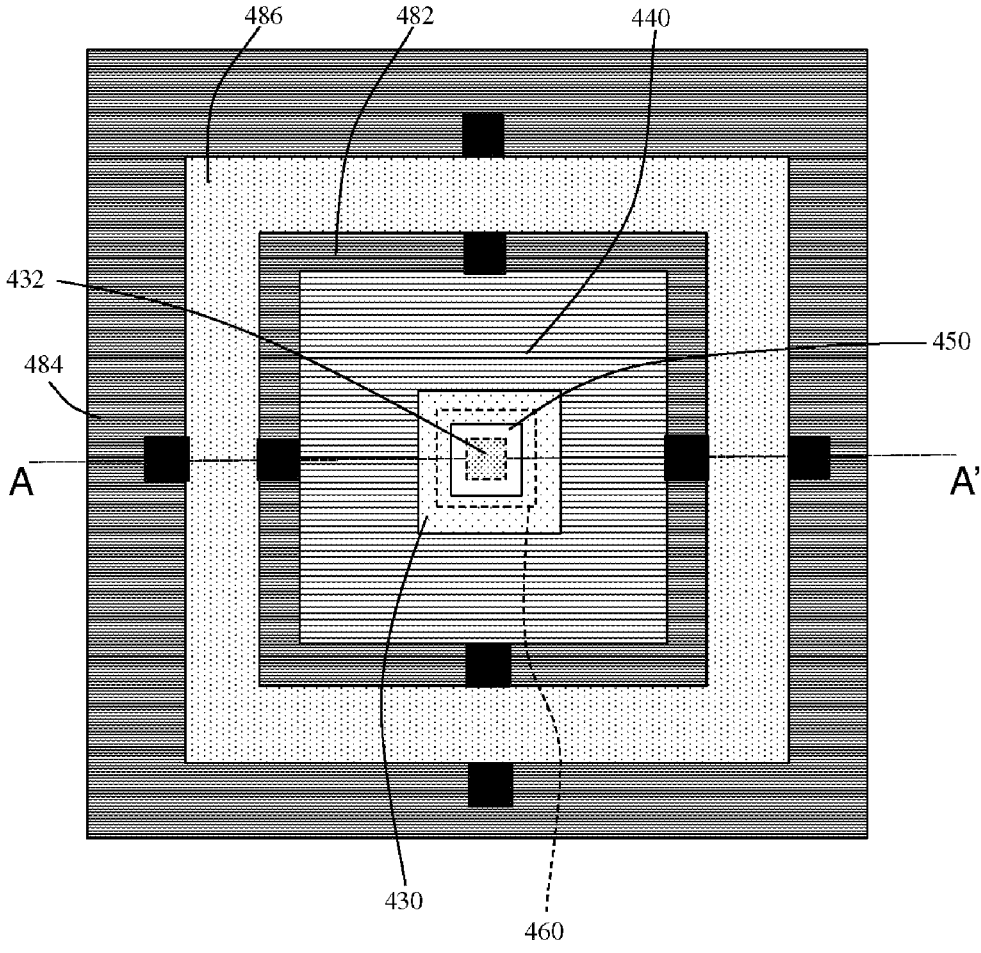
FIG. 4A schematically illustrates a top view of an embodiment of a photodiode according to the present invention.
Figure 4B:
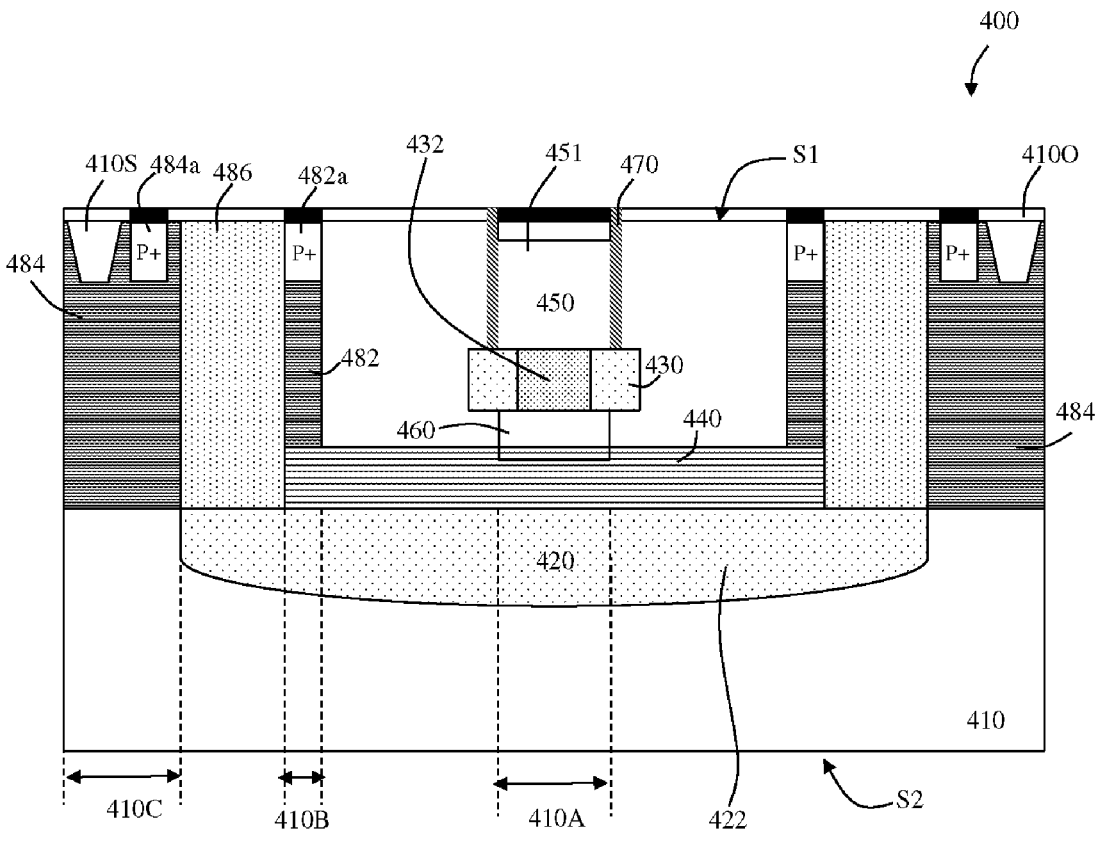
FIG. 4B schematically illustrates a cross-sectional view along line AA' of FIG. 4A.

FIG. 4A schematically illustrates a top view of an embodiment of a photodiode according to the present invention, FIG. 4B schematically illustrates a cross-sectional view along line AA' of FIG. 4A. Referring to FIG. 4A and FIG. 4B, an embodiment of a photodiode 400 includes a substrate 410, a first collection layer 420, a first type well layer 430, a second type well layer 440 and a second collection layer 450. The substrate 410 has a first surface S1 and a second surface S2 opposite to the first surface S1, wherein a bias region 410A, a signal region 410B and a ground region 410C can be defined on the substrate 410. In this embodiment, the substrate 410 can be a silicon substrate which has a shallow trench isolation structure 410S and an oxide insulation layer 4100 covering the first surface S1, as shown in FIG. 4A and FIG. 4B. Specifically, there are at least the following characteristics in terms of the advantages of IC manufacturing process and electrical isolation when the substrate 410 using the shallow trench isolation structure 410S. For example: reducing the area occupied by the surface of the substrate 410 (silicon wafer), increasing the packing density of components (Packing Density), maintaining excellent surface flatness (Planarity), reducing the latch-up effect (Latch-up Immunity) and comparing Less channel width erosion (Channel-width Encroachment), etc. In other embodiment, the substrate 410 may also be other silicon wafer substrate with isolation structures, for example, a silicon wafer substrate of LOCal Oxidation of Silicon (LOCOS) technology.

Please referring to FIG. 4A and FIG. 4B, the first collection layer 420 is formed in the substrate and doped with a first semiconductor material 422, wherein the first collection layer 420 is located within the bias region 410A and the signal region 410B. In this embodiment, the first collection layer 420 can be an N-type semiconductor layer, that is, the first collection layer 420 may be a semiconductor material layer doped with pentavalent elements. For example, the first semiconductor material 422 can be used by Phosphorus, Arsenic, Antimony or other pentavalent elements. In this embodiment, Phosphorus is used, for example, but the present invention is not limited thereto.

In detail, the method of forming the first collection layer 420 may be used by implanting or diffusing the pentavalent element (such as phosphorus atoms) into the substrate 410 with a certain concentration to form the first collection layer 420, wherein the first collection layer 420 can be a N-type semiconductor layer. In one embodiment, a P-type semiconductor layer can be formed if the first collection layer 420 is doped with a semiconductor material of trivalent elements. In this embodiment, the first collection layer 420 is used N-type semiconductor layer, for example. In addition, when light is absorbed by the first collection layer 420, the first collection layer 420 will generate electron-hole pairs. Specifically, the first collection layer 420 in this embodiment mainly absorbs light with a wavelength of 400 nm to 1100 nm to generate electron-hole pairs.

Please referring to FIG. 4A and FIG. 4B, the first type well layer is formed in the substrate and disposed between the first surface S1 and first collection layer 420, wherein the first type well layer 430 is located within the bias region 410A. In this embodiment, the first type well layer 430 can be an N-well, that is, the first type well layer 430 can be a semiconductor material layer using pentavalent elements. For example, the first type well layer 430 can be used by Phosphorus, Arsenic, Antimony or other pentavalent elements. In this embodiment, Phosphorus is used, for example, but the present invention is not limited thereto.

In detail, the method of forming the first type well layer 430 may be used by implanting or diffusing the pentavalent element (such as phosphorus atoms) into the substrate 410 with a certain concentration to form the first type well layer 430, wherein the first type well layer 430 can be an N-well. In one embodiment, a P-type semiconductor layer can be formed if the first type well layer 430 is doped with a semiconductor material of trivalent elements. The first type well layer 430 of this embodiment takes the N-well as an example to illustrate.

In one embodiment, the photodiode 400 further includes a first heavily doped layer 432, wherein the first heavily doped layer 432 is formed in the first type well layer 430, as shown in FIG. 4B. Similarly, the method of forming the first heavily doped layer 432 can be used by implanting or diffusing the pentavalent element (such as phosphorus atoms) into the first type well layer 430 with a certain concentration to form the first heavily doped layer 432 shown as the FIG. 4B, wherein the first heavily doped layer 432 can be an N+ doped layer.

In addition, the second type well layer 440 is formed in the substrate and disposed between the first type well layer 430 and the first collection 420, wherein the second well layer 440 is located within the bias region 410A and the signal region 410B, as shown in FIG. 4A and FIG. 4B. In this embodiment, the second type well layer 440 can be a P-well, that is, the second type well layer 440 can also be a semiconductor material layer doped with trivalent element. For example, the second type well layer 440 can be used by Boron, Aluminum, Gallium or other trivalent elements. In this embodiment, Boron is used, for example, but the present invention is not limited thereto.

Similarly, the method of forming the second type well layer 440 may be used by implanting or diffusing the trivalent element (such as boron atoms) into the substrate 410 with a certain concentration to form the second type well layer 440 as shown in FIG. 4B, wherein the second type well layer 440 can be a P-well. In one embodiment, an N-well can be formed if the second type well layer 440 is doped with a semiconductor material of pentavalent elements. In this embodiment, the second type well layer 440 takes P-well, for example.

Please referring to FIG. 4A and FIG. 4B, the second collection layer 450 is formed in the substrate and doped with a second semiconductor material 451, wherein the second collection layer 450 is disposed between the first surface S1 and the second type well layer 440. In this embodiment, the second semiconductor material 451 can be germanium, silicon germanium or the combination thereof. Specifically, the second collection layer 450 can be a semiconductor material layer having quadrivalent element or combination thereof. In this embodiment, the quadrivalent element can be carbon, silicon or germanium, wherein the second collection layer 450 takes germanium, for example.

In detail, the method of forming the second collection layer 450 can be used by growing germanium crystal on the first type well layer 430 (such as Epitaxy method), and then the second collection layer 450 is connected electrically with the first type well layer 430. In this embodiment, when light is absorbed by the second collection layer 450, the second collection layer 450 will generate electron-hole pairs. Specifically, the first collection layer 420 in this embodiment mainly absorbs light with a wavelength of 400 nm to 1700 nm to generate electron-hole pairs. The specific mechanism of the photodiode 400 in this embodiment using the first collection layer 420 and the second collection layer 450 for different wavelength ranges will be explained after the subsequent structure description is completed.

In this embodiment, the photodiode 400 further includes a first type semiconductor layer 460 disposed between the first type well layer 430 and the second type well layer 440, wherein the first type semiconductor layer 460 and the second well layer 440 can be doped with the same or similar semiconductor material. In particular, the first type semiconductor layer 460 can be doped with the trivalent element, such as Boron, Aluminum or Gallium. In this embodiment, the first type semiconductor layer 460 takes boron as example, but the present invention is not limited thereto.

Similarly, the method of forming the first type semiconductor layer 460 can be used by implanting or diffusing the trivalent element (such as boron atoms) into the substrate 410 with a certain concentration to form the first type semiconductor layer 460 as shown in FIG. 4B, wherein the first type semiconductor layer 460 can be a P-type semiconductor layer. In one embodiment, an N-type semiconductor layer can be formed if the first type semiconductor layer 460 is doped with a semiconductor material of pentavalent elements. In this embodiment, the first type semiconductor layer 460 takes P-type semiconductor layer, for example.

In order to preferably form the second collection 450 in the substrate 410, the photodiode 400 further includes a buffer material layer 470. The buffer material layer 470 is partially formed on the first surface S1 of the substrate 410 and partially formed in the substrate 410, wherein the portion of the buffer material layer 470 is disposed between the second collection layer 450 and the first type well layer 430. Specifically, the buffer material layer 470 can be formed by stacking quadrivalent elements such as silicon, silicon germanium, and germanium, wherein silicon (Si), silicon germanium ($Si_{1-x}Ge$), and germanium (Ge) can be stacked in order. In this embodiment, the method of forming the buffer material layer 470 can be used by depositing silicon (Si), silicon germanium ($Si_{1-x}Ge$), and germanium (Ge) on the first well layer 430 in order, wherein the concentration of germanium atoms will become more and more concentrated.

In order to output the signal of electron-hole pairs generated from the first collection layer 420 or the second collection layer 450 due to light irradiation, the photodiode 400 may further include a semiconductor material connection layer 482. The semiconductor material connection layer 482 is formed in the substrate and located within the signal region 410B, as shown in FIG. 4B. In this embodiment, the semiconductor material connection layer 482 is physically connected with the second type well layer 440. The semiconductor material connection layer 482 and the second type well layer 440 can be doped with the same material or similar semiconductor material.

In detail, the semiconductor material connection layer 482 is a P-type semiconductor doped layer if the second type well layer 440 is a P-well. It means that the semiconductor material connection layer 482 can be doped with a semiconductor material of trivalent elements. For example, the semiconductor material connection layer 482 can be used by Boron, Aluminum, Gallium or other trivalent elements. In this embodiment, Boron is used, for example, but the present invention is not limited thereto. Similarly, the method of forming the semiconductor material connection layer 482 may be used by implanting or diffusing the trivalent element (such as boron atoms) into the substrate 410 with a certain concentration to form the semiconductor material connection layer 482 as shown in FIG. 4B. In one embodiment, an N-type semiconductor doped layer can be formed if the semiconductor material connection layer 482 is doped with a semiconductor material of pentavalent elements. In this embodiment, semiconductor material layer 482 takes P-type semiconductor doped layer, for example.

Please referring to FIG. 4A and FIG. 4B, the photodiode 400 further includes a semiconductor material ground layer 484, wherein the semiconductor material ground layer 484 is formed in the substrate 410 and located within the ground region 410C, as shown in FIG. 4B. Specifically, the semiconductor material ground layer 484 can be a P-well, that is, the semiconductor material ground layer 484 can be doped with a semiconductor material of trivalent elements. For example, the semiconductor material ground layer 484 can be used by Boron, Aluminum, Gallium or other trivalent elements. In this embodiment, Boron is used, for example, but the present invention is not limited thereto.

Similarly, the method of forming the semiconductor material ground layer 484 may be used by implanting or diffusing the trivalent element (such as boron atoms) into the substrate 410 with a certain concentration to form the semiconductor material ground layer 484, as shown in FIG. 4B, wherein the semiconductor material ground layer 484 is a P-well. In one embodiment, an N-type semiconductor layer can be formed if the semiconductor material ground layer 484 is doped with a semiconductor material of pentavalent elements. In this embodiment, the semiconductor material ground layer 484 takes P-well, for example.

In order to avoid the leakage current generated by the forward bias between the semiconductor material connection layer 482 and the semiconductor material ground layer 484, the photodiode 400 further includes a semiconductor material insulator layer 486. The semiconductor material insulator layer 486 is formed in the substrate and located between the signal region 410B and the ground region 410C. In this embodiment, the semiconductor material insulator layer 486 and the first collection layer 420 can be doped with the same or similar semiconductor material, that is, the semiconductor material insulator layer 486 may be a semiconductor material layer doped with pentavalent elements. For example, the semiconductor material insulator layer 486 can be used by Phosphorus, Arsenic, Antimony or other pentavalent elements. In this embodiment, Phosphorus is used, for example, but the present invention is not limited thereto.

In one embodiment, the doping concentration of the semiconductor material insulator layer 486 is higher than that of the first collection layer 420 in order to better avoid leakage current. Similarly, the method of forming the semiconductor material insulator layer 486 can be used by implanting or diffusing the pentavalent element (such as phosphorus atoms) into the substrate 410 with a certain concentration to form the semiconductor material insulator layer 486 shown as the FIG. 4B, wherein the semiconductor material insulator layer 486 can be an N-type semiconductor layer. In one embodiment, if the semiconductor material insulator layer 486 is doped with a semiconductor material of trivalent element, a P-type semiconductor layer can be formed. The present embodiment takes an N-type semiconductor layer as an example for illustration.

In this embodiment, the photodiode 400 further includes a second heavily doped layer 482a, 484a respectively formed in the semiconductor connection layer 482 and the semiconductor ground layer 486, as shown in FIG. 4B. Similarly, the method of forming the second heavily doped layer 482a, 484a can be used by implanting or diffusing the trivalent element (such as boron atoms) into the semiconductor connection layer 482 and the semiconductor ground layer 486 with a certain concentration to form the second heavily doped layer 482a, 484a as shown in FIG. 4B. The second heavily doped layer 482a, 484a is P+ doped layer. In one embodiment, the second heavily doped layer 482a, 484a will be N+ doped layer if the second heavily doped layer 482a, 484a is doped with a semiconductor material of pentavalent elements. In this embodiment, the second heavily doped layer 482a, 484a takes P+ doped layer, for example.

In the photodiode 400, if a bias voltage is applied above the first-type well layer 430 in the bias region 410A, the avalanche region will be generated between the first type well layer 430 and the second type well layer 440. In this way, after the first collection layer 420 absorbs light with a wavelength of 400 nm~1100 nm to generate electron-hole pairs, the electrons will enter the avalanche region and generate a large number of current signals, wherein the current signals will be outputted through the semiconductor material connection layer 482.

Similarly, since the second collection layer 450 is made of germanium, the second collection layer 450 will also generate electron-hole pairs after absorbing light with a wavelength of 400 nm~1700 nm. At this time, the holes will enter the avalanche region and a large number of current signal will be generated, wherein the current signal will be output through the semiconductor material connection layer 482.

Specifically, the photodiode 400 of this embodiment has a double absorption layer structure with different semiconductor materials, so that the photodiode 400 of this embodiment can detect near-infrared rays (NIR) and short-wave infrared rays (SWIR), and then the photodiode 400 will have better performance. In other words, the photodiode 400 of this embodiment can detect not only the light with a wavelength of 400 nm~1100 nm, but also the light with a wavelength of 400 nm~1700 nm, so as to improve the application range and performance. In this embodiment, a method for fabricating the above-mentioned photodiode 400 will be provided below.

Figure 5A:
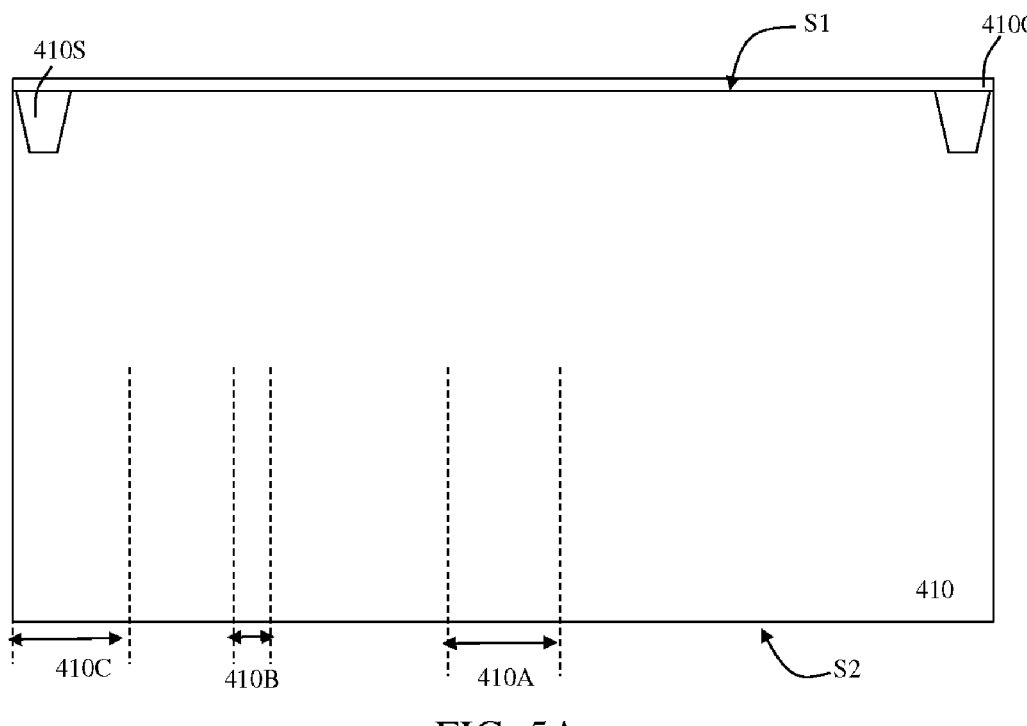
FIGS. 5A to 5N schematically illustrate a process flow of an embodiment of manufacturing a photodiode according to the present invention.
Figure 5B:
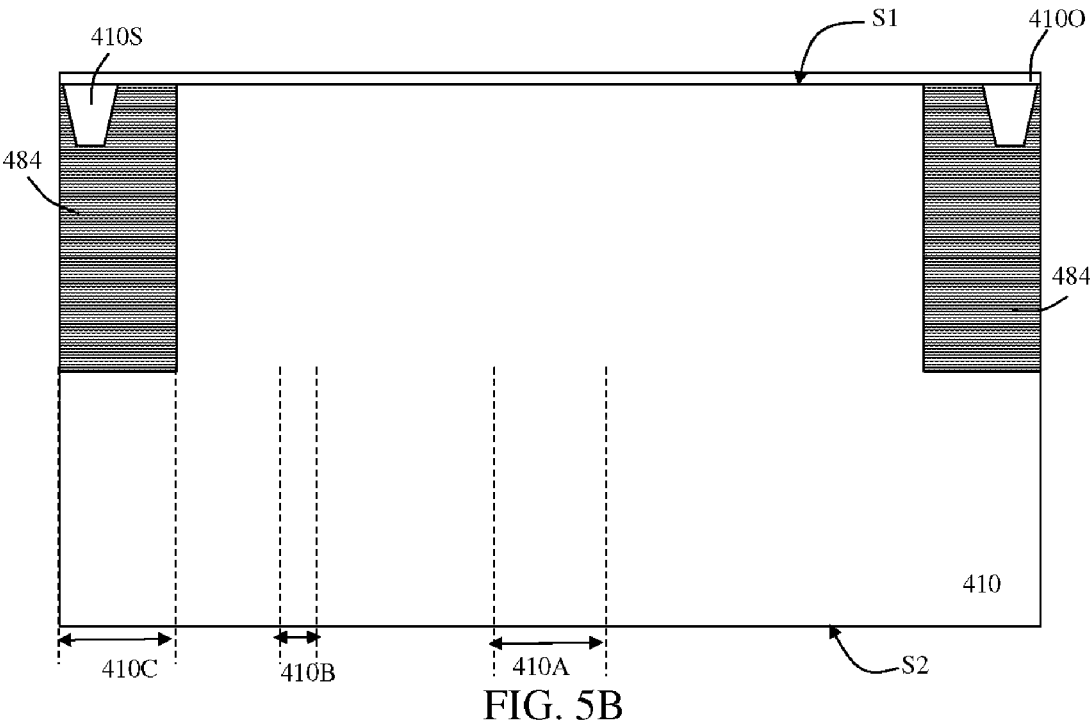
Figure 5C:
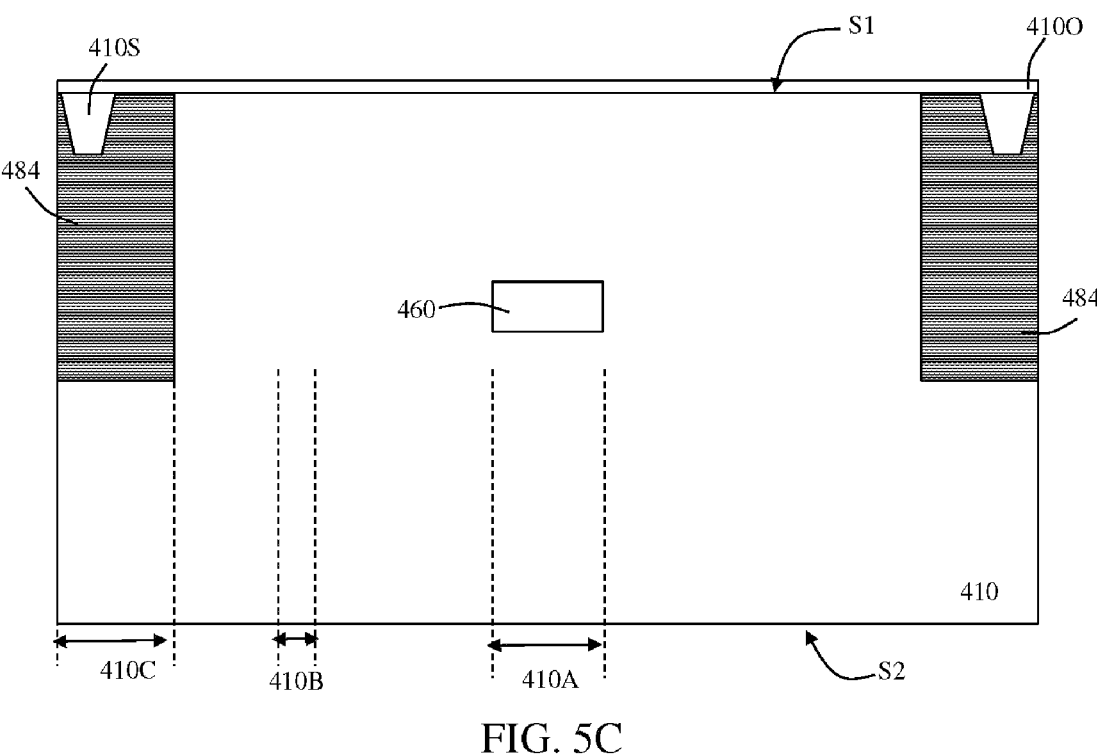
Figure 5D:
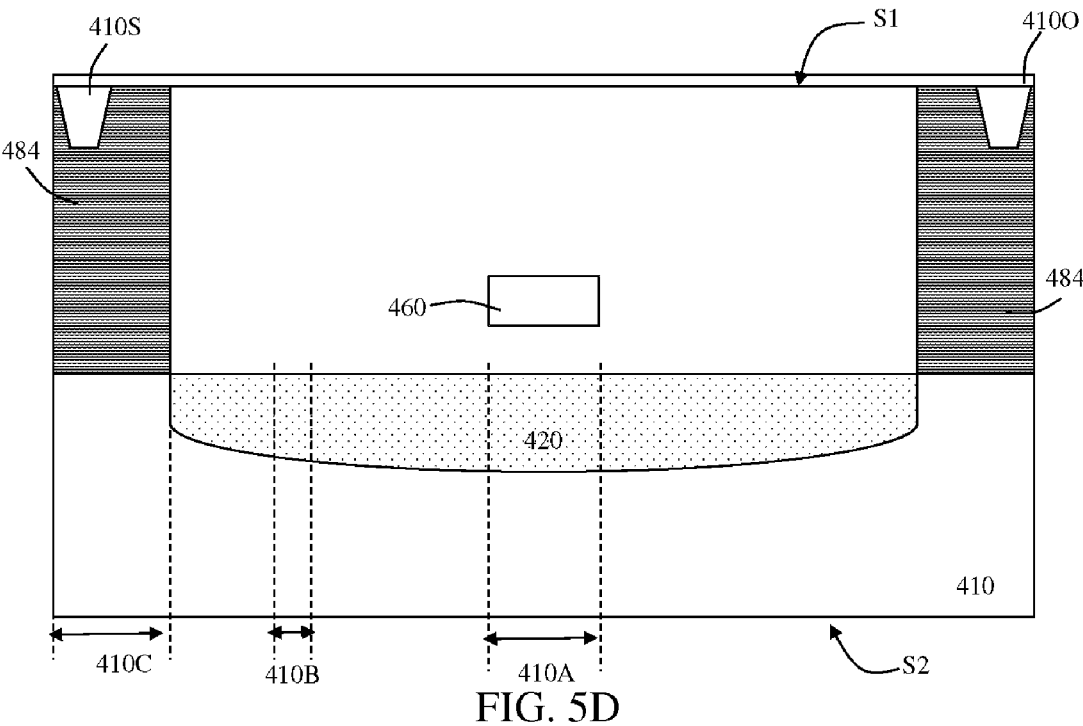
Figure 5E:
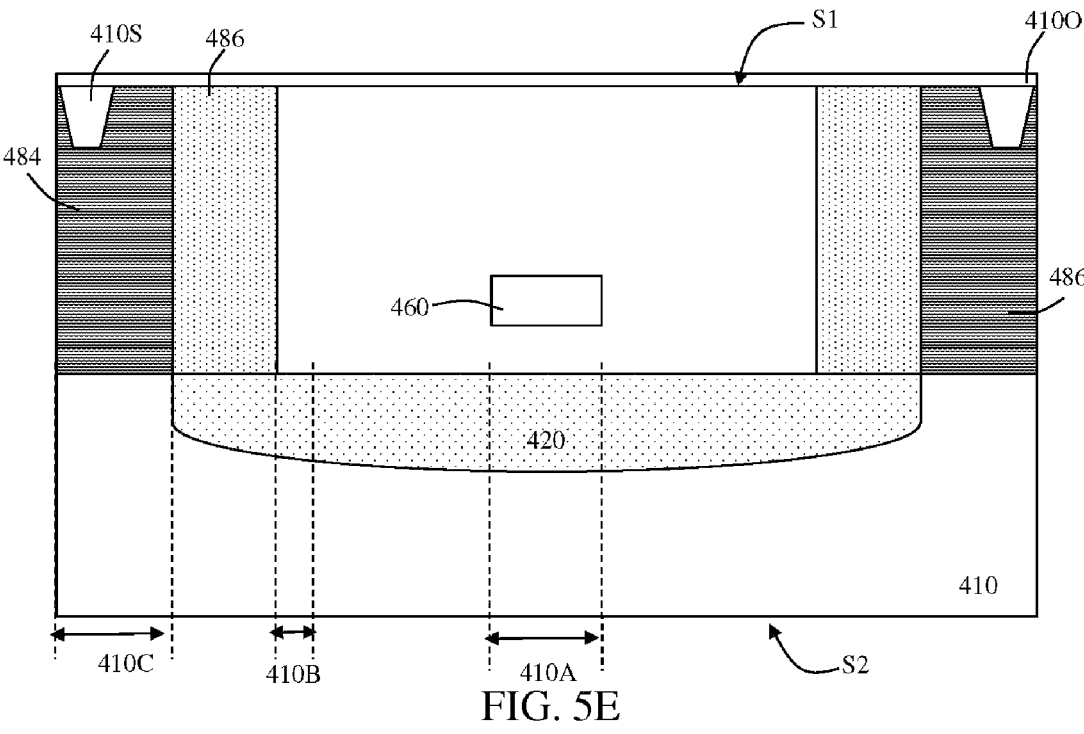
Figure 5F:
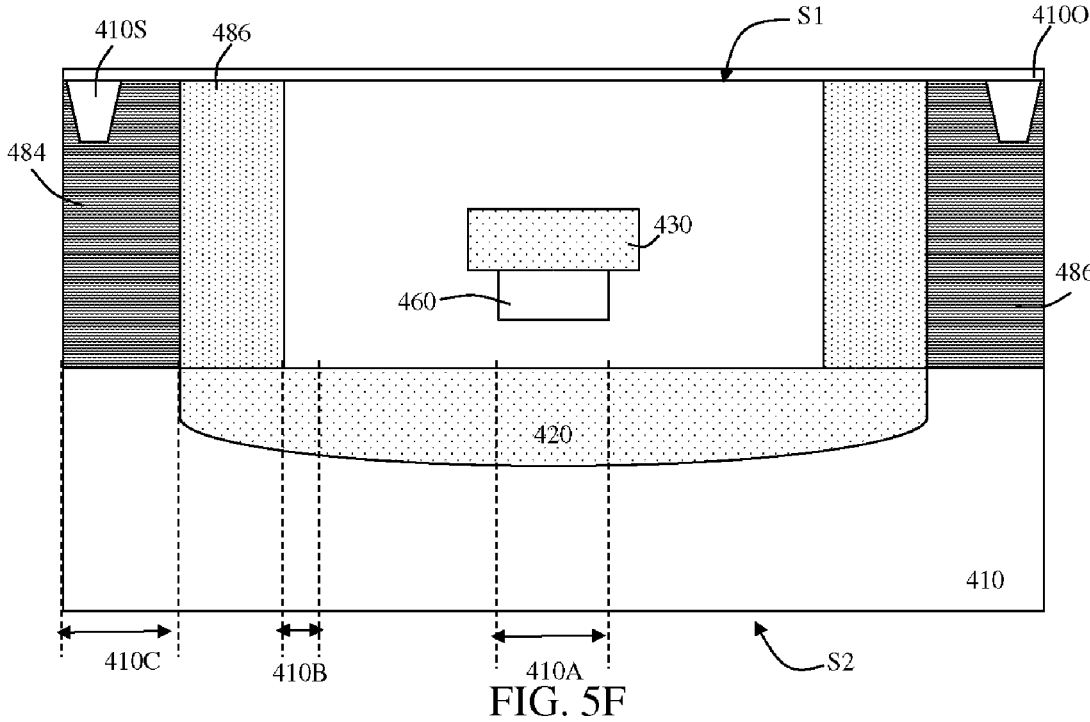
Figures 5G, 5H:
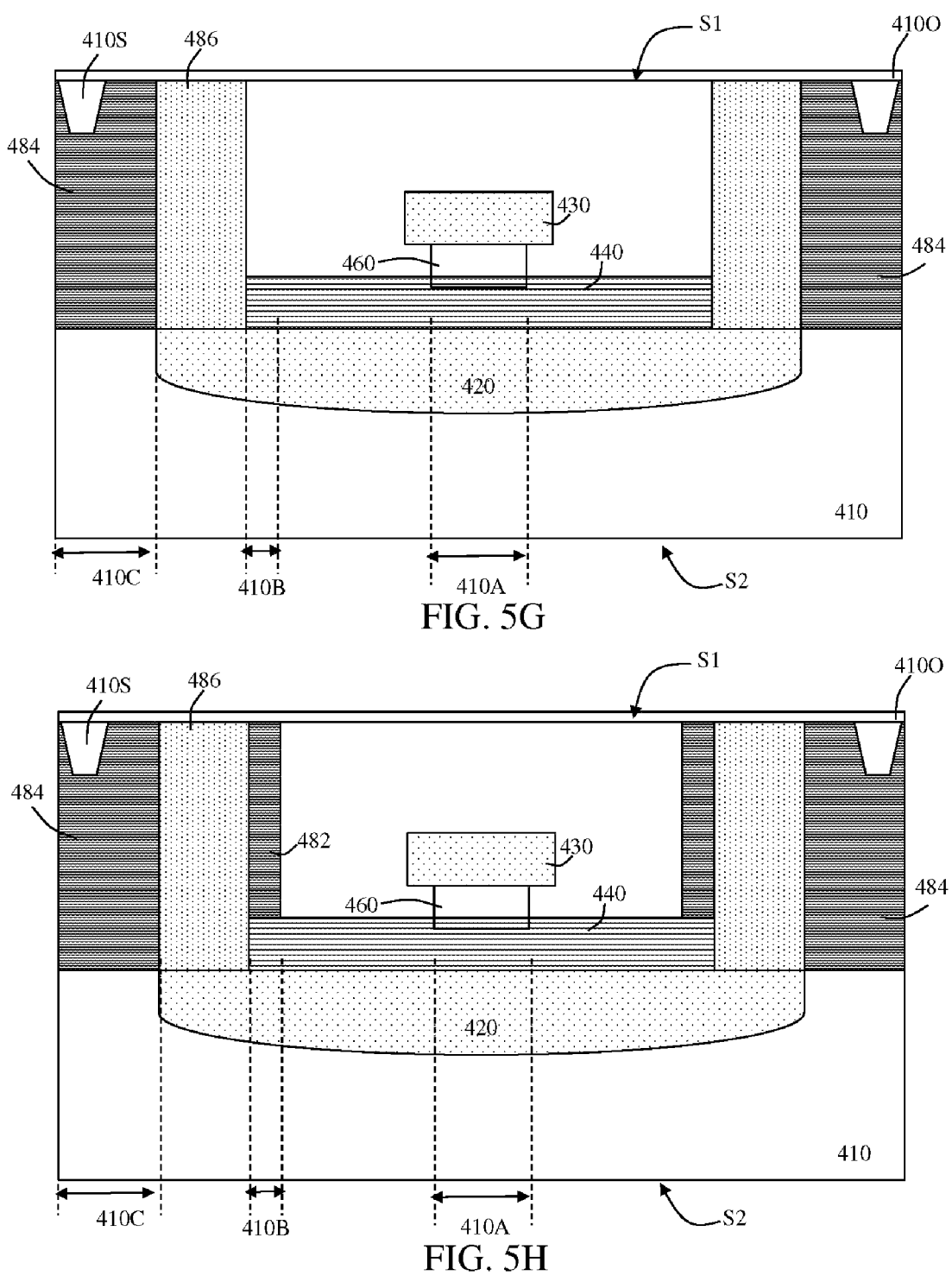
Figures 5I, 5J:
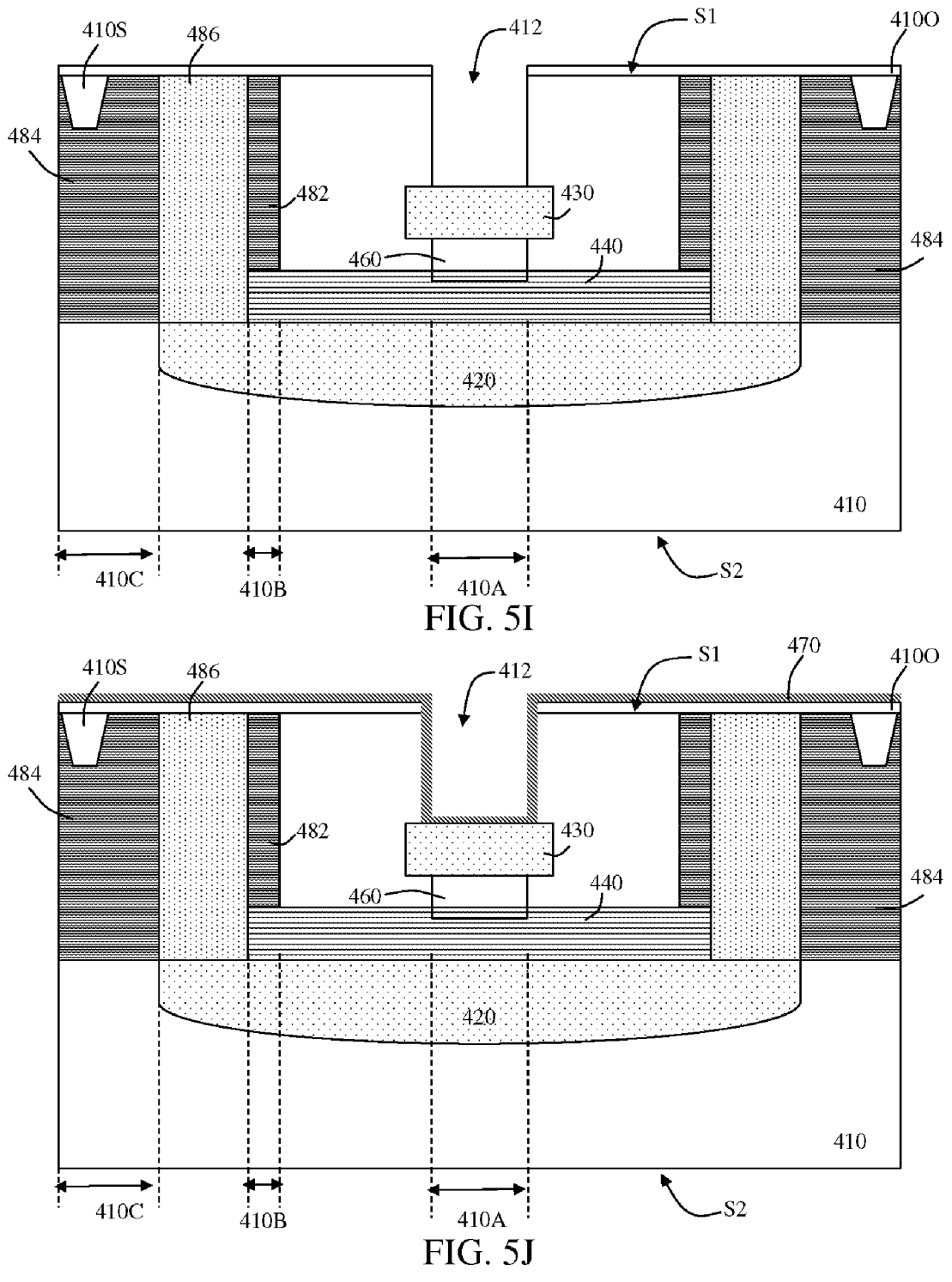
Figures 5K, 5L:
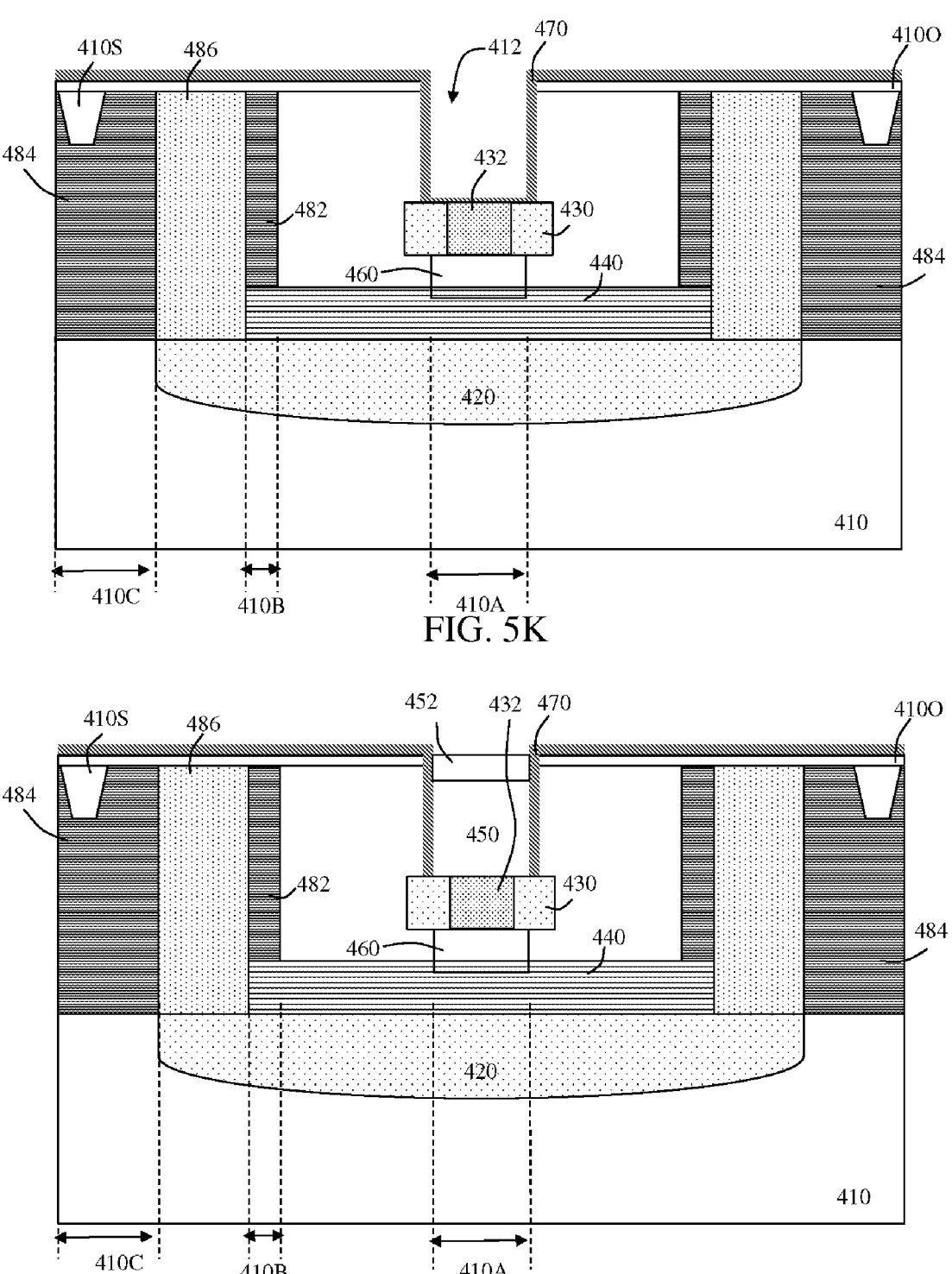
Figures 5M, 5N:
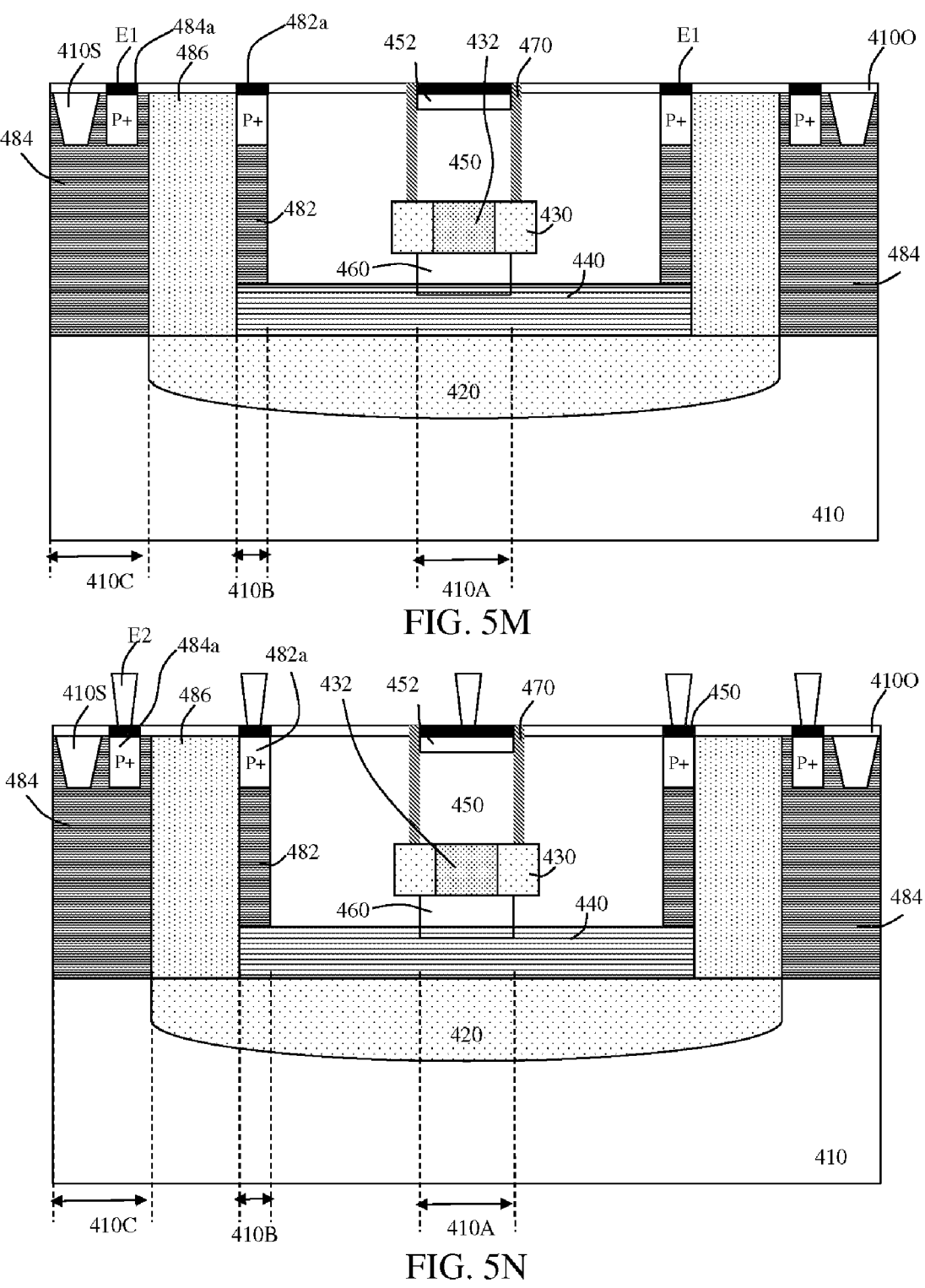

FIGS. 5A to 5N schematically illustrate a process flow of an embodiment of manufacturing a photodiode according to the present invention. Referring to FIG. 5A, the above-mentioned substrate 410 is provided. In this embodiment, the substrate 410 has a first surface S1 and a second surface S2 opposite to the first surface S1, wherein a bias region 410A, a signal region 410B and a ground region 410C can be defined on the substrate 410. Similarly, the substrate 410 can be a silicon substrate which has a shallow trench isolation structure 410S and an oxide insulation layer 4100 covering the first surface S1, as shown in FIG. 5A. Specifically, there are at least the following characteristics in terms of the advantages of IC manufacturing process and electrical isolation when the substrate 410 using the shallow trench isolation structure 410S. For example: reducing the area occupied by the surface of the substrate 410 (silicon wafer), increasing the packing density of components (Packing Density), maintaining excellent surface flatness (Planarity), reducing the latch-up effect (Latch-up Immunity) and comparing Less channel width erosion (Channel-width Encroachment), etc. In other embodiment, the substrate 410 may also be other silicon wafer substrate with isolation structures, for example, a silicon wafer substrate of LOCal Oxidation of Silicon (LOCOS) technology.

Referring to FIG. 5B, the above-mentioned semiconductor material ground layer 484 is formed in the substrate 410 and located within the ground region 410C. In this embodiment, the method of forming the semiconductor material ground layer 484 may be used by implanting or diffusing the trivalent element (such as boron atoms) into the substrate 410 with a certain concentration to form the semiconductor material ground layer 484 on the ground region 410C, as shown in FIG. 5B. Similarly, the semiconductor material ground layer 484 is a P-well. In one embodiment, an N-type semiconductor layer can be formed if the semiconductor material ground layer 484 is doped with a semiconductor material of pentavalent elements. In this embodiment, the semiconductor material ground layer 484 takes P-well, for example.

Referring to FIG. 5C, the above-mentioned first type semiconductor layer 460 is formed in the substrate 410. In this embodiment, the method of forming the first type semiconductor layer 460 can be used by implanting or diffusing the trivalent element (such as boron atoms) into the substrate 410 with a certain concentration to form the first type semiconductor layer 460, as shown in FIG. 5C. The first type semiconductor layer 460 can be a P-type semiconductor layer. In one embodiment, an N-type semiconductor layer can be formed if the first type semiconductor layer 460 is doped with a semiconductor material of pentavalent elements. In this embodiment, the first type semiconductor layer 460 takes P-type semiconductor layer, for example.

Referring to FIG. 5D, the above-mentioned first collection layer 420 is formed in the substrate 410 by doping the above-mentioned first semiconductor material layer 422, wherein the first collection layer 420 is located within the bias region 410A and the signal region 410B. Similarly, the first collection layer 420 can be an N-type semiconductor layer, that is, the first collection layer 420 may be a semiconductor material layer doped with pentavalent elements. Specifically, the first semiconductor material 422 can be used by Phosphorus, Arsenic, Antimony or other pentavalent elements. In this embodiment, Phosphorus is used, for example, but the present invention is not limited thereto.

Similarly, the method of forming the first collection layer 420 may be used by implanting or diffusing the pentavalent element (such as phosphorus atoms) into the substrate 410 with a certain concentration to form the first collection layer 420, wherein the first collection layer 420 can be a N-type semiconductor layer. In one embodiment, a P-type semiconductor layer can be formed if the first collection layer 420 is doped with a semiconductor material of trivalent elements. In this embodiment, the first collection layer 420 is used N-type semiconductor layer, for example.

Referring to FIG. 5E, the above-mentioned semiconductor material insulator layer 486 is formed in the substrate and located between the signal region 410B and the ground region 410C. In this embodiment, the semiconductor material insulator layer 486 and the first collection layer 420 can be doped with the same or similar semiconductor material, that is, the semiconductor material insulator layer 486 may be a semiconductor material layer doped with pentavalent elements. For example, the semiconductor material insulator layer 486 can be used by Phosphorus, Arsenic, Antimony or other pentavalent elements. In this embodiment, Phosphorus is used, for example, but the present invention is not limited thereto.

Similarly, the doping concentration of the semiconductor material insulator layer 486 is higher than that of the first collection layer 420 in order to better avoid leakage current. In this embodiment, the method of forming the semiconductor material insulator layer 486 can be used by implanting or diffusing the pentavalent element (such as phosphorus atoms) into the substrate 410 with a certain concentration to form the semiconductor material insulator layer 486 shown as the FIG. 5E, wherein the semiconductor material insulator layer 486 can be an N-type semiconductor layer. In one embodiment, if the semiconductor material insulator layer 486 is doped with a semiconductor material of trivalent element, a P-type semiconductor layer can be formed. The present embodiment takes an N-type semiconductor layer as an example for illustration.

Referring to FIG. 5F, the above-mentioned first type well layer 430 is formed in the substrate 410, wherein the first type well layer 430 is disposed between the first surface S1 and the first collection layer 420 and located within the bias region 410A. Similarly, the first type well layer 430 can be an N-well, that is, the first type well layer 430 can be a semiconductor material layer using pentavalent elements. For example, the first type well layer 430 can be used by Phosphorus, Arsenic, Antimony or other pentavalent elements. In this embodiment, Phosphorus is used, for example, but the present invention is not limited thereto.

In detail, the method of forming the first type well layer 430 may be used by implanting or diffusing the pentavalent element (such as phosphorus atoms) into the substrate 410 with a certain concentration to form the first type well layer 430, as shown in FIG. 5F, wherein the first type well layer 430 can be an N-well. In one embodiment, a P-type semiconductor layer can be formed if the first type well layer 430 is doped with a semiconductor material of trivalent elements. The first type well layer 430 of this embodiment takes the N-well as an example to illustrate.

Referring to FIG. 5G, the above-mentioned second type well layer 440 is formed in the substrate 410, wherein the second type well layer is disposed between the first type well layer 430 and the first collection layer 420 and located within the bias region 410A and the signal region 410B. Similarly, the second type well layer 440 can be a P-well, that is, the second type well layer 440 can also be a semiconductor material layer doped with trivalent element. For example, the second type well layer 440 can be used by Boron, Aluminum, Gallium or other trivalent elements. In this embodiment, Boron is used, for example, but the present invention is not limited thereto.

Similarly, the method of forming the second type well layer 440 may be used by implanting or diffusing the trivalent element (such as boron atoms) into the substrate 410 with a certain concentration to form the second type well layer 440, as shown in FIG. 5G, wherein the second type well layer 440 can be a P-well. In one embodiment, an N-well can be formed if the second type well layer 440 is doped with a semiconductor material of pentavalent elements. In this embodiment, the second type well layer 440 takes P-well, for example.

Referring to FIG. 5H, the above-mentioned semiconductor material connection layer 482 is formed in the substrate 410, wherein the semiconductor material connection layer 482 is located within the signal region 410B and is physically connected with the second type well layer 440. In this embodiment, the semiconductor material connection layer 482 and the second type well layer 440 can be doped with the same material or similar semiconductor material.

In detail, the semiconductor material connection layer 482 is a P-type semiconductor doped layer if the second type well layer 440 is a P-well. It means that the semiconductor material connection layer 482 can be doped with a semiconductor material of trivalent elements. For example, the semiconductor material connection layer 482 can be used by Boron, Aluminum, Gallium or other trivalent elements. In this embodiment, Boron is used, for example, but the present invention is not limited thereto.

Similarly, the method of forming the semiconductor material connection layer 482 may be used by implanting or diffusing the trivalent element (such as boron atoms) into the substrate 410 with a certain concentration to form the semiconductor material connection layer 482 as shown in FIG. 5H. In one embodiment, an N-type semiconductor doped layer can be formed if the semiconductor material connection layer 482 is doped with a semiconductor material of pentavalent elements. In this embodiment, the semiconductor material connection layer 482 takes P-type semiconductor doped layer, for example.

Referring to FIG. 5I, a groove 412 exposing the first type well layer 430 is formed on the first surface S1 of the substrate 410. In this embodiment, the method of forming the groove 412 is used by etching the substrate 410 to form the groove through the traditional lithographic etching technology. Specifically, the method of etching the substrate to form the groove 412 can be used by dry etching or wet etching, it can be determined according to the standard process of the semiconductor factory.

Referring to FIG. 5J, the above-mentioned buffer material layer 470 is formed on the first surface S1 of the substrate 410 and covers the first type well layer 430. In this embodiment, the buffer material layer 470 can be formed by stacking quadrivalent elements such as silicon, silicon germanium, and germanium, wherein silicon (Si), silicon germanium ($Si_{1-x}Ge$), and germanium (Ge) can be stacked in order. In this embodiment, the method of forming the buffer material layer 470 can be used by depositing silicon (Si), silicon germanium ($Si_{1-x}Ge$), and germanium (Ge) on the first well layer 430 in order, wherein the concentration of germanium atoms will become more and more concentrated.

Referring to FIG. 5J, the above-mentioned first heavily doped layer 432 is formed in the first type well layer 430. Similarly, the method of forming the first heavily doped layer 432 can be used by implanting or diffusing the pentavalent element (such as phosphorus atoms) into the first type well layer 430 with a certain concentration to form the first heavily doped layer 432 shown as the FIG. 5J, wherein the first heavily doped layer 432 can be an N+ doped layer. In one embodiment, a P+ doped layer is formed if the first heavily doped layer 432 is doped with a semiconductor material of trivalent elements. In this embodiment, the first heavily doped layer 432 takes N+ doped layer, for example.

Referring to FIG. 5L, the above-mentioned second collection layer 450 is formed in the groove 412 of the substrate 410 by using the above-mentioned second semiconductor material 451. In this embodiment, the second semiconductor material 451 can be germanium, silicon germanium or the combination thereof. Specifically, the second collection layer 450 can be a semiconductor material layer having quadrivalent element or combination thereof. In this embodiment, the quadrivalent element can be carbon, silicon or germanium, wherein the second collection layer 450 takes germanium, for example. In detail, the method of forming the second collection layer 450 can be used by growing germanium crystal on the first type well layer 430 (such as Epitaxy method), and then the second collection layer 450 is connected electrically with the first type well layer 430. In this embodiment, the concentration of germanium element layer-by-layer epitaxy can be more and more concentrated, and a first type germanium layer 452 is formed on the top layer, as shown in FIG. 5L.

Referring to FIG. 5M, the above-mentioned second heavily doped layer 482a, 484a respectively formed in the semiconductor connection layer 482 and the semiconductor ground layer 486. Similarly, the method of forming the second heavily doped layer 482a, 484a can be used by implanting or diffusing the trivalent element (such as boron atoms) into the semiconductor connection layer 482 and the semiconductor ground layer 486 with a certain concentration to form the second heavily doped layer 482a, 484a as shown in FIG. 5M. The second heavily doped layer 482a, 484a is P+ doped layer. In one embodiment, the second heavily doped layer 482a, 484a will be N+ doped layer if the second heavily doped layer 482a, 484a is doped with a semiconductor material of pentavalent elements. In this embodiment, the second heavily doped layer 482a, 484a takes P+ doped layer, for example.

Referring to FIG. 5N, a metal contact layer E1 is formed on the second heavily doped layer 482a, 484a and the first type germanium layer 452. In this embodiment, the material of the metal contact layer E1 may be used by metal silicide, which reduces the contact resistance of the transistor at the gate, source and drain. Finally, a metal conductive layer E2 can be formed on the metal contact layer E1, as shown in FIG. 5N, so far, a method of manufacturing the aforementioned photodiode 400 is roughly completed. It should be noted that the formation sequence of the above-mentioned doped layers can be determined according to the needs of the designer. This embodiment is only used to illustrate the fabrication method of the photodiode 400, and the formation sequence is not particularly limited.

Figure 6A:
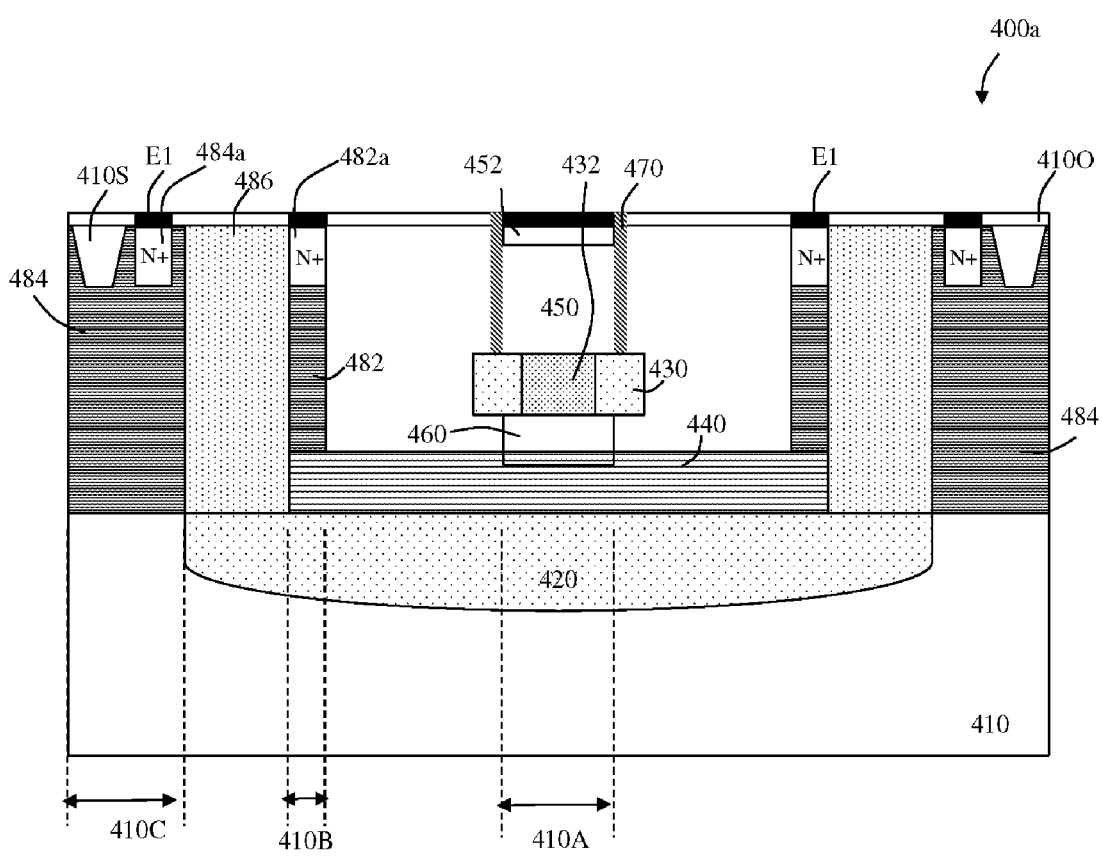
FIG. 6A is a schematic diagram of a photodiode according to another embodiment of the present invention.

FIG. 6A is a schematic diagram of a photodiode according to another embodiment of the present invention. Please referring to FIG. 6A and FIG. 4B at the same time, the structure of the photodiode 400a of this embodiment is similar to that of the aforementioned photodiode 400. The difference between the photodiode 400a and photodiode 400 is that the doping types of each doped layers are reversed. For example, in the photodiode 400, the first collection layer 420, the first type well layer 430, the first heavily doped layer 432 and the semiconductor material insulator layer 486 are doped or implanted with N-type semiconductor material. The second type well layer 440, the first type semiconductor layer 460, the semiconductor material connection layer 482, the second heavily doped layers 482a, 486a and the semiconductor material ground layer 484 are doped or implanted with a P-type semiconductor material.

On the contrary, in the photodiode 400a, the first collection layer 420, the first type well layer 430, the first heavily doped layer 432 and the semiconductor material insulator layer 486 are doped or implanted with P-type semiconductor material. The second type well layer 440, the first type semiconductor layer 460, the semiconductor material connection layer 482, the second heavily doped layers 482a, 486a and the semiconductor material ground layer 484 are doped or implanted with N-type semiconductor material. In this embodiment, the photodiode 400a also has the advantages mentioned above for the photodiode 400, and the details are not iterated herein.

Figure 6B:
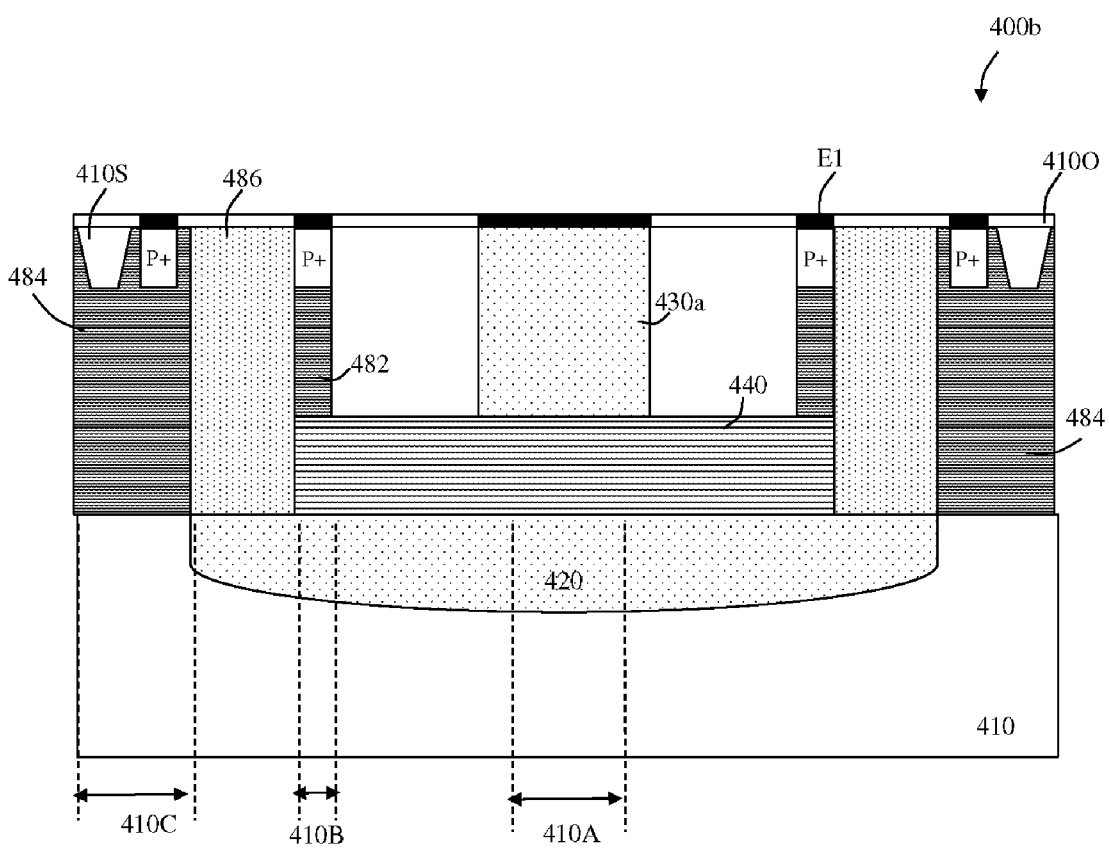
FIG. 6B is a schematic diagram of a photodiode according to another embodiment of the present invention.

FIG. 6B is a schematic diagram of a photodiode according to another embodiment of the present invention. Please referring to FIG. 6B and FIG. 4B at the same time, the structure of the photodiode 400a of this embodiment is similar to that of the aforementioned photodiode 400. The difference between the two is that the photodiode 400*b* does not have the aforementioned second collection layer 450, the first heavily doped layer 432 and the first type semiconductor layer 460, but only has the first type well layer 430*a*, as shown in FIG. 6B. Similarly, the photodiode 400*b* also has the advantages mentioned above for the photodiode 400, and the details are not iterated herein.

Figure 6C:
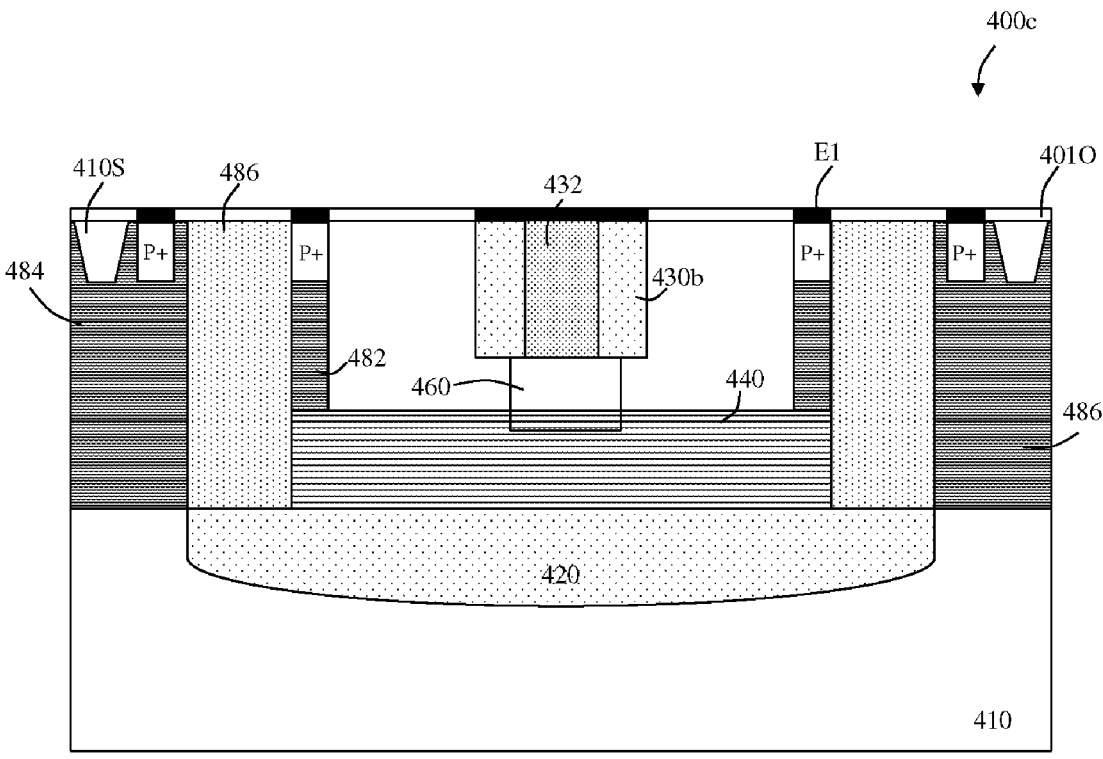
FIG. 6C is a schematic diagram of a photodiode according to yet another embodiment of the present invention.

FIG. 6C is a schematic diagram of a photodiode according to yet another embodiment of the present invention. Please referring to FIG. 6C and FIG. 4B at the same time, the structure of the photodiode 400*c* of this embodiment is similar to that of the aforementioned photodiode 400. The difference between the two is that the photodiode 400*c* does not have the aforementioned second collection layer 450, but only has the first heavily doped layer 432 and the first type well layer 430*b*, as shown in FIG. 6C. Similarly, the photodiode 400*c* also has the advantages mentioned above for the photodiode 400, and the details are not iterated herein.

It should be noted that the photodiode 400*b* and the photodiode 400*c* may also adopt a doping type structure similar to that of the photodiode 400*a*. In addition, the aforementioned photodiodes 400, 400*a*, 400*b*, and 400*c* may be a single photon avalanche diode (SPAD).

In one embodiment, an optical sensor (not illustrated) which can have the above-mentioned photodiodes 400, 400*a*, 400*b* in array is also provided. The optical sensor will also has the advantages mentioned above for the photodiode 400, 400*a*, 400*b*, and 400*c* and the details are not iterated herein.

In summary, the photodiode of the present invention has the first collection layer and the second collection layer, therefore, the photodiode of the present invention can be used through the structure of the double absorbing layer with different semiconductor materials. The photodiode of this embodiment has better performance in detecting near infrared rays (NIR) and short wave infrared rays (SWIR). In other words, the photodiode of the present embodiment can detect not only the light of the conventional wavelength, but also the near infrared wavelength, so as to improve the application range and performance of the photodiode of the present embodiment. In addition, the present invention also provides a method for manufacturing the above-mentioned photodiode.

In view of above-mentioned embodiments, the photodiode provided by the present disclosure can have better photon detection efficiencies without coupling the P substrate to a negative voltage level.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a photodiode, comprising:
providing a substrate, wherein the substrate has a first surface and a second surface opposite to the first surface, the substrate defines a bias region, a ground region and a signal region;
forming a first collection layer in the substrate by using a first semiconductor material, wherein the first collection layer is located within the bias region and the signal region;
forming a first type well layer in the substrate, wherein the first type well layer disposed between the first surface and the first collection layer is located within the bias region;
forming a second type well layer in the substrate, wherein the second type well layer disposed between the first type well layer and the first collection layer is located within the bias region and signal region;
forming a groove exposing the first type well layer on the first surface of the substrate; and
forming a second collection layer in the groove of the substrate by using a second semiconductor material.

2. The manufacturing method for the photodiode of claim 1, wherein the second semiconductor material includes germanium, silicon germanium or the combination thereof.

3. The manufacturing method for the photodiode of claim 1, further comprising:
forming a semiconductor material ground layer in the substrate, wherein the semiconductor material ground layer is located within the ground region.

4. The manufacturing method for the photodiode of claim 1, further comprising:
forming a semiconductor material connection layer in the substrate, wherein the semiconductor material connection layer located within the signal region is physically connected with the second type well layer.

5. The manufacturing method for the photodiode of claim 1, further comprising:
forming a semiconductor material insulator layer in the substrate, wherein the semiconductor material insulator layer is located between the signal region and the ground region.

* * * * *